United States Patent
Van Dalen et al.

(10) Patent No.: US 6,724,021 B2
(45) Date of Patent: Apr. 20, 2004

(54) SEMICONDUCTOR DEVICES AND THEIR PERIPHERAL TERMINATION

(75) Inventors: Rob Van Dalen, Eindhoven (NL); Christelle Rochefort, Haasrode (BE); Godefridus A. M. Hurkx, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 256 days.

(21) Appl. No.: 10/067,205

(22) Filed: Feb. 5, 2002

(65) Prior Publication Data

US 2002/0134998 A1 Sep. 26, 2002

(30) Foreign Application Priority Data

Feb. 15, 2001 (GB) .............................................. 0103715

(51) Int. Cl.[7] ........................................... H01L 29/745
(52) U.S. Cl. ..................... 257/213; 257/334; 257/206; 257/342; 257/339; 257/374; 257/487; 257/488; 257/489
(58) Field of Search ................... 257/213, 334, 257/206, 342, 339, 374, 487, 488, 489; 438/222, 226, 296

(56) References Cited

U.S. PATENT DOCUMENTS

| 4,375,125 A | 3/1983 | Byatt ........................... 29/588 |
| 4,754,310 A | 6/1988 | Coe ............................ 357/13 |
| 6,452,230 B1 * | 9/2002 | Boden ........................ 257/341 |

FOREIGN PATENT DOCUMENTS

| DE | 19848828 | 5/2000 | ........... H01L/29/06 |
| WO | WO0159844 | 8/2001 | ........... H01L/29/06 |
| WO | WO0159846 | 8/2001 | ........... H01L/29/78 |
| WO | WO0159847 | 8/2001 | ........... H01L/29/78 |

* cited by examiner

*Primary Examiner*—Steve Loke
*Assistant Examiner*—Thomas Magee
(74) *Attorney, Agent, or Firm*—Aaron Waxler

(57) ABSTRACT

A semiconductor device, such as a power MOSFET, Schottky rectifier or p-n rectifier, has a voltage-sustaining zone (20) between a first (21, 23, 31*a*) and second (22) device regions adjacent to respective first and second opposite surfaces (11, 12) of a semiconductor body 10. Trenched field-shaping regions (40) including a resistive path (42) extend through the voltage-sustaining zone (20) to the underlying second region (22), so as to enhance the breakdown voltage of the device. The voltage-sustaining zone (20) and the trenched field-shaping regions (40) are present in both the active device area (A) and in the peripheral area (P) of the device. A further resistive path (53) extends across the first surface (11), outwardly over the peripheral area (P). This further resistive path (53) provides a potential divider that is connected to the respective resistive paths (42) of successive underlying trenched field-shaping regions (40) in the peripheral area (P). Thereby a gradual variation is achieved in the potential (V2) applied by the successive trenched field-shaping regions (40) in the peripheral area (P) of the voltage-sustaining zone (20). This advantageous peripheral termination reduces device susceptibility to deviations in the field profile in this peripheral area (P).

27 Claims, 6 Drawing Sheets

SEMICONDUCTOR DEVICES AND THEIR PERIPHERAL TERMINATION

This invention relates to semiconductor devices with trenched field-shaping regions extending through a voltage-sustaining zone. The invention provides such devices with an advantageous peripheral termination.

Many known types of semiconductor device comprise a semiconductor body that includes a voltage-sustaining zone between first and second device regions that have respective electrode connections adjacent to respective first and second opposite surfaces of the body. Field-effect transistors, for example MOSFETs, are one specific type having the voltage-sustaining zone as a drain drift region of the transistor. Power rectifiers, for example Schottky diodes or p-n junction diodes, are another specific type, in which the voltage-sustaining zone adjoins the rectifying junction.

Published German patent application DE-A-198 48 828 and the PCT published international patent applications WO 01/59844, WO 01/59847 and WO 01/59846 (our refs. PHNL000065; PHNL000066; PHNL000067) disclose the incorporation into such devices of trenched field-shaping regions including a resistive path that extends in trenches through the voltage-sustaining zone to the second electrode region; the trenches extend into the body from the first surface. The voltage-sustaining zone is so dimensioned and doped between the trenched field-shaping regions as to be depleted of free charge carriers between the trenched field-shaping regions in a voltage-blocking mode of operation.

This incorporation of trenched field-shaping regions enables desired voltage-sustaining, voltage-blocking, breakdown voltage characteristics of the devices to be obtained using a semiconductor region (or interposed semiconductor regions) that has (or have) a higher dopant concentration, and thus lower resistivity, than would conventionally be required by a conventional square law relationship between breakdown voltage and series resistivity. These devices are a modification of those disclosed in U.S. Pat. No. 4,754,310 (our reference PHB32740). The whole contents of U.S. Pat. No. 4,754,310, DE-A-198 48 828, WO 01/59844, WO 01/59846 and WO 01/59847 are hereby incorporated herein as reference material.

The various design parameters of the trenched field-shaping regions and voltage-sustaining zone can be optimised to generate a substantially uniform electric field distribution in the active device area between the first and second electrodes, as a result of the passage of a small leakage current through the trenched field-shaping regions. However, such devices are susceptible to deviations in the field profile that might occur near the periphery of the active area.

It is an aim of the present invention to provide a compatible but different scheme of trenched field-shaping regions in the peripheral area so as to reduce device susceptibility to deviations in the field profile in this area.

According to one aspect of the present invention, there is provided a semiconductor device in which the voltage-sustaining zone and the trenched field-shaping regions are present in both an active device area between the first and second electrode-connected regions and in a peripheral area that extends around the periphery of the active area. In the peripheral area, there is included a further resistive path that extends across the first surface, outwardly over the peripheral area. This further resistive path provides a potential divider that is connected to the underlying second region via respective resistive paths of the successive trenched field-shaping regions in the peripheral area. Thereby a gradual variation is achieved in the potential applied by the successive trenched field-shaping regions in the peripheral area of the voltage-sustaining zone.

The use of a resistive path to provide a potential divider over the peripheral area of a semiconductor device is known from U.S. Pat. No. 4,375,125 (our ref. PHB32700), the whole contents of which are hereby incorporated herein as reference material. However, this known use is not in the context of connections to trenched field-shaping regions that themselves include a resistive path to an underlying device region.

In a device in accordance with the present invention, the resistance of the further resistive path that provides the potential divider is typically an order of magnitude lower than the resistance of the resistive path of the trenched field-shaping regions. Although a linear potential gradient may be used along the potential divider, a more compact structure can be achieved by increasing the resistance of the further resistive path to a higher value towards outermost trenched field-shaping regions. This is achievable because the device sensitivity to a lateral field around the outermost regions is diminished after the inner field-shaping regions have gradually dropped a large fraction of the applied voltage.

Advantageous features in accordance with the present invention are set out in the appended claims. These and others will now be illustrated in specific embodiments of the invention, by way of example, now to be described with reference to the accompanying drawings, in which:

Figure 1:
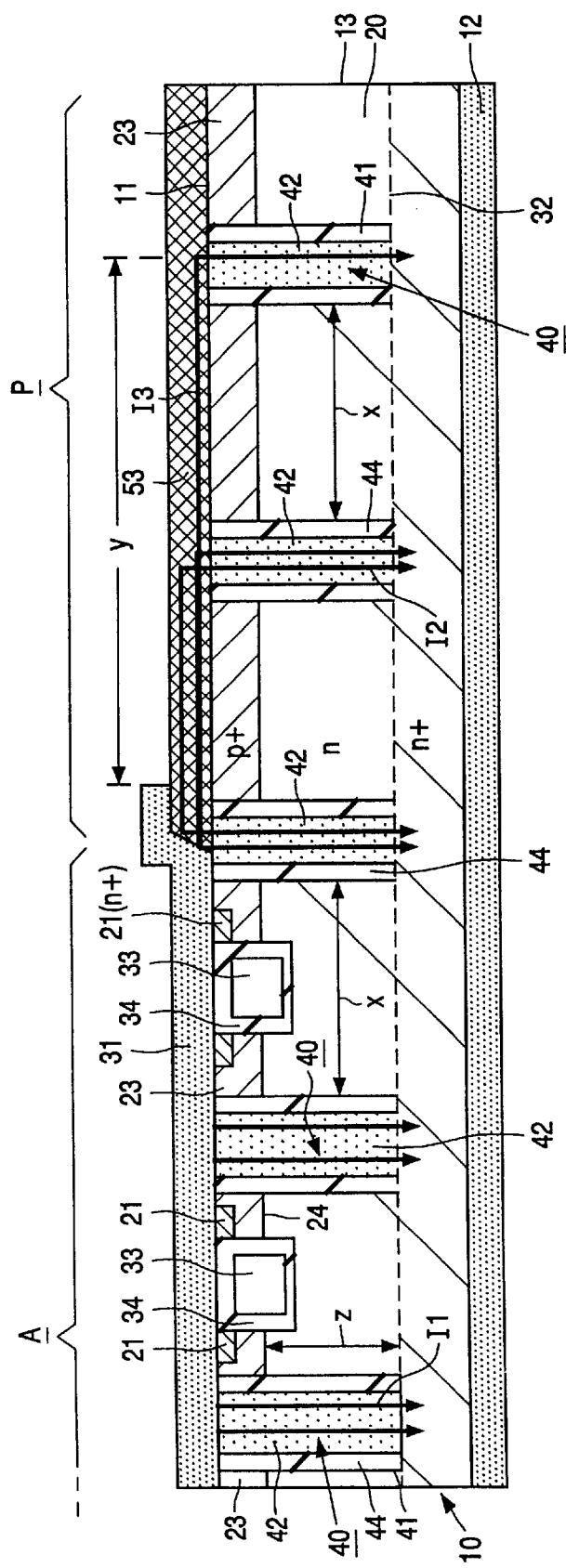
FIG. 1 is a diagrammatic cross-sectional view of part of the active device area and peripheral area of one MOSFET example of a semiconductor device in accordance with the invention, showing one example of trenched field-shaping regions.

It should be noted that the FIGS. 1 to 4A and 5 to 12 are diagrammatic, relative dimensions and proportions of parts having been shown exaggerated or reduced in size for the sake of clarity and convenience in the drawings. The same reference signs are generally used to refer to corresponding or similar features in the different embodiments.

FIG. 1 shows one embodiment of a semiconductor device comprising a monocrystalline semiconductor body 10 that includes a voltage-sustaining zone 20 between first and second device regions 21 and 22. These regions 21 and 22 have electrode connections adjacent to respective first and second opposite surfaces 11 and 12 of the body 10. In this example, the regions 21 and 22 are respective source and drain regions of a field-effect transistor and are contacted by electrodes 31 and 32. The source region 21 is separated, in the usual manner, from the voltage-sustaining zone 20 by a channel-accommodating body region 23 (also sometimes termed "base region") of the transistor that forms a p-n junction 24 with the zone 20. The voltage-sustaining zone 20 is a drain drift region of the transistor. The transistor is of the MOSFET type having an insulated gate 33 that is insulated from the region 23 by an intermediate gate dielectric layer 34, across which the gate 33 is capacitively coupled. Thus, the gate 33 serves in known manner for inducing and controlling a conduction channel in the region 23 between the source and drain regions 21 and 22, in a conducting state of the transistor.

The device of FIG. 1 is also of an advanced type having trenched field-shaping regions 40, such as disclosed in DE-A-198 48 828, WO 01/59844, WO 01/59846 and WO 01/59847. The trenched field-shaping regions 40 enhance the breakdown voltage of the device.

Thus, there are trenches 41 that extend into the body 10 from the surface 11. The layout of these trenches 41 may be in the form of an array and/or an interconnected network and/or an individual plurality of separate trenches. Each field-shaping region 40 includes in the trench 41 a resistive path 42 that extends thereby through the voltage-sustaining zone 20 to the electrode-connected region 22. The path 42 is connected between the electrodes 31 and 32. In a voltage-blocking state of the FIG. 1 MOSFET, a depletion layer spreads in the voltage-sustaining zone 20 from the reverse-biased p-n junction 24 and from the side-walls of the trenches 41. The dimensions x and z and doping n of the voltage-sustaining zone 20 are appropriately chosen in known manner such that the zone 20 between the trenched field-shaping regions 40 is depleted of free charge carriers in this voltage-blocking state.

Briefly stated, the breakdown enhancement results as follows. A small leakage current I1 passes through the resistive paths 42 between the electrodes 31 and 32, and so these paths 42 act as resistors that generate a linear potential gradient and hence a uniform electric field distribution. By making the dimensions x of the zone 20 sufficiently small, this uniform electric field can be passed to the intermediate areas of the zone 20 (the drift region of the MOSFET). This leads to a reduction in peak electric field in the voltage-sustaining zone 20 and a corresponding increase in breakdown voltage.

However, because the device relies on this process of field profile shaping, it follows that the enhanced characteristics of such devices are susceptible to deviations from a flat field profile. Such deviations can occur near the edge of an active device area A. In practice, this means that the flat vertical field profile should be maintained some distance beyond the edge of the active area A, while also keeping the lateral electric field within reasonable limits. Such a situation can be achieved by adopting an edge termination structure in accordance with the present invention.

Thus, in the device of FIG. 1 in accordance with the present invention, the voltage-sustaining zone 20 and the trenched field-shaping regions 40 are present in both the active device area A between the electrode-connected regions 21 and 22 and in a peripheral area P that extends around the periphery of the active area A. A further resistive path 53 extends across the surface 11, outwardly over the peripheral area P. This further resistive path 53 provides a potential divider (see segments Rlat in FIG. 4A) that is connected respectively to successive underlying trenched field-shaping regions 40 in the peripheral area P. Thereby the potential applied by the successive trenched field-shaping regions 40 in the peripheral area P of the voltage-sustaining zone 20 is graded. The resulting gentle lateral transition is described later with reference to FIG. 3.

Thus, the vertical resistive paths 42 in the peripheral area P beyond the active area A are connected between the electrode region 22 and a further resistive path 53 to provide a gradual change of the potential around the edge of the active area A. The magnitude of a small leakage current I3 that runs through the lateral path 53 to the vertical paths 42 can be tailored easily by choosing an appropriate resistivity for the material (or materials) of the path 53 and by choosing an appropriate length for the path 53 connecting with the underlying trenched field-shaping regions 40. It should be noted that this edge leakage current I3 (through the lateral path 53) is acceptable in such devices which by design exhibits a small leakage current I1 (through the vertical paths 42). The magnitude of the leakage currents I2 that flow through the vertical paths 42 in the peripheral area P decreases the farther out the path 42 is from the active area A.

The peripheral area P having the successive trenched field-shaping regions 40 connected to the potential divider may extend laterally over a distance y from the active device area A that is larger than half the thickness z of the voltage-sustaining zone 20 and less than 4 times the thickness z. Typically the distance y is between 1 and 3 times the thickness z. By adopting the present invention, an optimum gradual change in potential in the peripheral area P of the zone 20 can be achieved even over a short distance y. Thus, a compact device can be constructed in accordance with the invention.

FIG. 1 shows only an outer part of the active area A and shows the peripheral area P extending the whole distance to the edge 13 of the body 10. Only three peripheral trenched field-shaping regions 40 are shown in FIG. 1, by way of an illustratory example. However, more such trenched field-shaping regions 40 would normally be included across such a section of the peripheral area P.

Figure 2A:
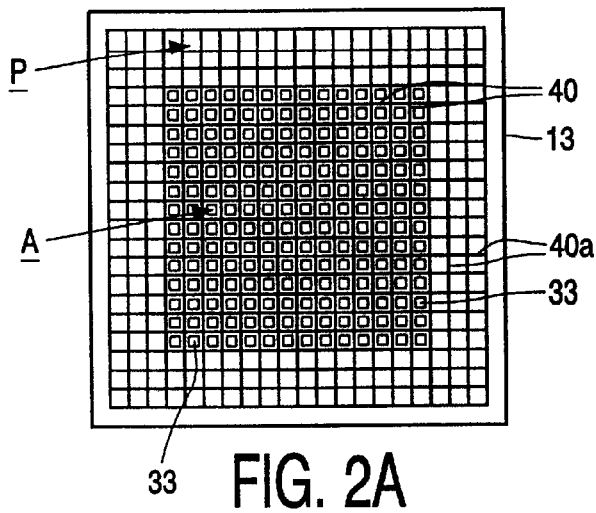
FIGS. 2A to 2C are diagrammatic plan views of the active device area and peripheral area of three layout examples of such a semiconductor device in accordance with the invention.
Figure 2B:
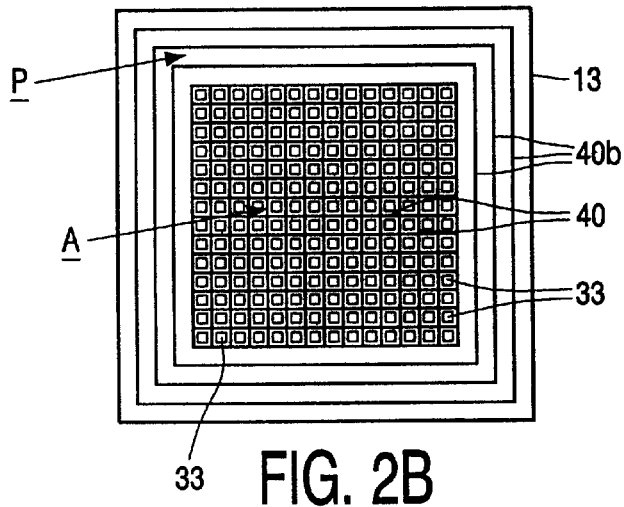
Figure 2C:
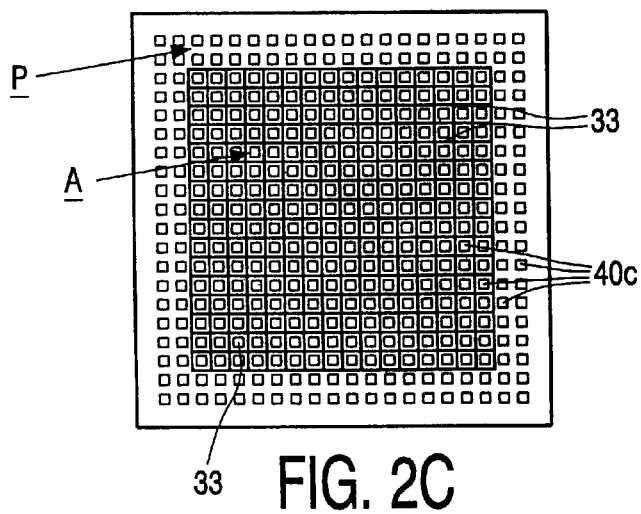

FIGS. 2A, 2B, & 2C illustrate schematically three variant layouts for these trenched field-shaping regions 40 in the active device area A and in the peripheral area P of a cellular power MOSFET. The active area A is indicated by the presence of the MOS gates 33 of the active MOSFET cells. In FIGS. 2A and 2B, the trenched field-shaping regions 40 in the active area A are in the form of a network that extends around individual central gates 33 of each MOSFET cell. In FIG. 2C, the gates 33 are in the form of a network that extends around individual central trenched field-shaping regions 40c of each cell in the active area A. Square array geometries for the networks are shown for convenience in the drawings, but other geometries may be used such as, for example, a close-packed hexagonal array geometry.

In FIG. 2A, the trenched field-shaping regions 40 in the active area A are in the form of a network that extends into the peripheral area P to provide the trenched field-shaping regions 40a in the peripheral area P. In FIGS. 2B and 2C, the trenched field-shaping regions 40b and 40c in the peripheral area P are a separate plurality from the region(s) 40 in the active device area A. In FIG. 2B, the regions 40b in the peripheral area P comprise concentric annular stripe regions that surround the active device area A. In FIG. 2C, the trenched field-shaping regions 40c in the peripheral area P comprise separate island regions that are distributed around the peripheral area P.

It is also possible to have a combination of these different designs of trenched field-shaping regions 40 in the peripheral area P. Thus, for example, the innermost regions 40 of the peripheral area P may comprise extensions of the active-area network (of FIGS. 2A and 2B) that extends into an adjacent part of the peripheral area P. These network extensions 40a may be surrounded by a distribution of separate island regions 40c (FIG. 2C) and by one or more outermost annular regions 40b (FIG. 2B).

The various device parts in the active device area A may be of known materials, doping concentrations, dimensions and construction. Typically, the resistive paths 42 are of semi-insulating material, for example polycrystalline silicon doped with oxygen and/or nitrogen. As illustrated in FIG. 1, the paths 42 may be separated from the zone 20 and region 23 by a thin insulating layer 44, for example of silicon dioxide. The same materials and construction may be used for the field-shaping regions 40 in the extension of the zone 20 in the peripheral area P of the device. In a typical example in a silicon body 10, the zone 20 may have a uniform doping concentration in the range of $5.10^{15}$ to $5.10^{16}$ arsenic or phosphorus atoms. $cm^{-3}$, and the pitch $p_x$ of trenched regions 40 may be in the range of 2 μm (micrometers) to 10 μm. The thickness z of zone 20 is related to the desired breakdown voltage of the device. For breakdown voltages of between 60V and 1 kV, the thickness z is typically in the range of 3 μm (micrometers) to 50 μm.

FIG. 1 illustrates a trench-gate MOST configuration, in which the trench-gate 33 extends through the thickness of the p-type body region 23 to the drain drift region 20. However, a DMOST configuration may alternatively be realised in which a planar gate 33 is present on a gate dielectric 34 on the surface 11. In DMOST, the drain drift region 20 extends to the surface 11 below the center of the gate 33. The present invention may also be used for a diode rectifier, having a p+ anode region 23 and an n+ cathode region as its main electrode regions that are separated by the intermediate voltage-sustaining zone 20. Thus, there are no device parts 21, 33 & 34 in such a diode rectifier, and the p-type region 23 is continuous apart from its interruption by the field-shaping regions 40.

Figure 3:
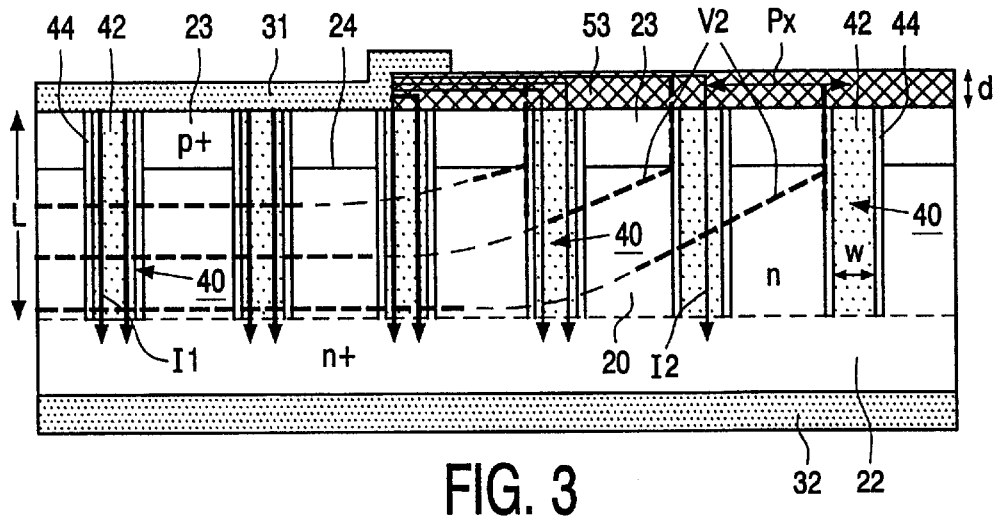
FIG. 3 is a diagrammatic cross-sectional view of a simplified device part similar to that of FIG. 1, indicating a gentle lateral transition in electric field from the active device area across the peripheral area such as is achievable in accordance with the invention.

FIG. 3 is a simplified schematic that is useable more generally for representing embodiments of the present invention, including a trench-gate MOSFET embodiment, a DMOST embodiment and a PN diode rectifier embodiment. Such a simplified schematic is used also in FIGS. 5 to 10 and FIG. 12, which are also generally applicable, for example, to trench-gate MOSFET, DMOST and PN diode rectifier embodiments.

FIG. 3 shows a main electrode 31 of the device that provides a simple electrode connection to the vertical resistive paths 42 in the active device area A and to the lateral resistive path 53 of the potential divider. In the PN diode rectifier embodiments, this electrode 31 is the anode that is connected to the p-type anode region 23. In the MOST embodiments, this electrode 31 is the source that is connected to the n-type source region 21 and is also usually shorted somewhere in the device layout to the p-type body region 23. The voltage to be blocked by the device is applied between the main electrodes 31 and 32 at the opposite surfaces 11 and 12 of the device body 10.

FIG. 1 and FIG. 3 illustrate both the n-type voltage-sustaining zone 20 and the p-type region 23 extending to the edge 13 of the body 10. This is a simple structure that is easy to manufacture. With the layout design of FIGS. 2A and 2B, the regions 40 in the peripheral area P divide the extension of the p-type region 23 into separate regions that are electrically isolated from each other, except in so far as they may be contacted by the layer of resistive material of the path 53. As described later, the particular resistive material chosen for the path 53 (for example oxygen-doped polycrystalline silicon) may actually form an electrical barrier at its interface with these separate p-type regions 23. With the layout design of FIG. 2C, the extension of the p-type region 23 in the peripheral area P is an electrically continuous region in which the field-shaping regions 40 are distributed. This continuous peripheral region 23 can be insulated from the overlying resistive path 53. Alternatively the region(s) 23 may be omitted from the peripheral area P.

The simplified schematic of FIG. 3 illustrates a basic device structure used for modelling the field profiles in the blocking state of the device, with the zone 20 depleted between the field-shaping regions 40. The modelling involved varying the resistance ration Rvert/Rlat of the vertical and lateral paths 42 and 53, and varying the number of regions 40 connected by a resistive path 53 in the peripheral area P, i.e. varying the distance y in FIG. 1. The thickness z of the voltage-sustaining zone 20 is determined by the desired voltage blocking capability, as already described. This thickness z determines also the minimum length L of the vertical paths 42. A stripe geometry was assumed for all the field-shaping regions 40, i.e. with the stripes extending perpendicular to the plane of the drawing. Furthermore, it was assumed that the various p-type regions 23 between the striped regions 40 are not connected to each other so that they take their voltage from the interaction with the top resistive layer that provides the path 53.

Figure 4A:
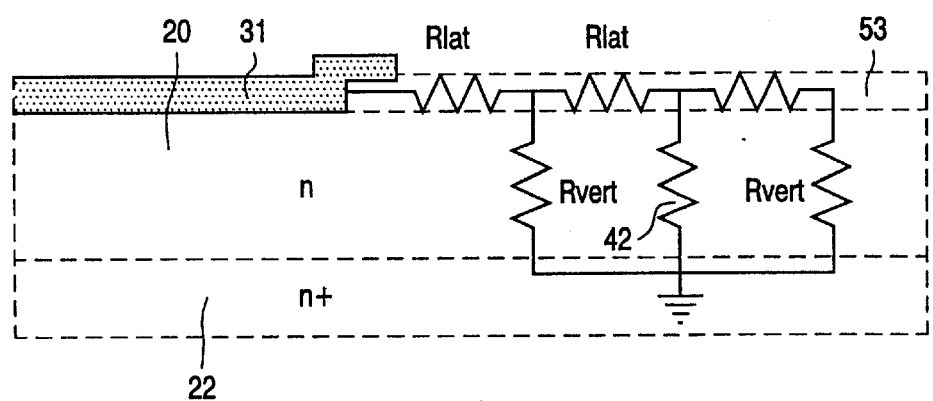
FIG. 4A is a diagrammatic representation of lateral resistance segments (of value Rlat) and vertical resistance segments (of value Rvert) in respective lateral and vertical resistive paths in the peripheral area of the device of FIGS. 1 and 3 in accordance with the invention.
Figure 4B:
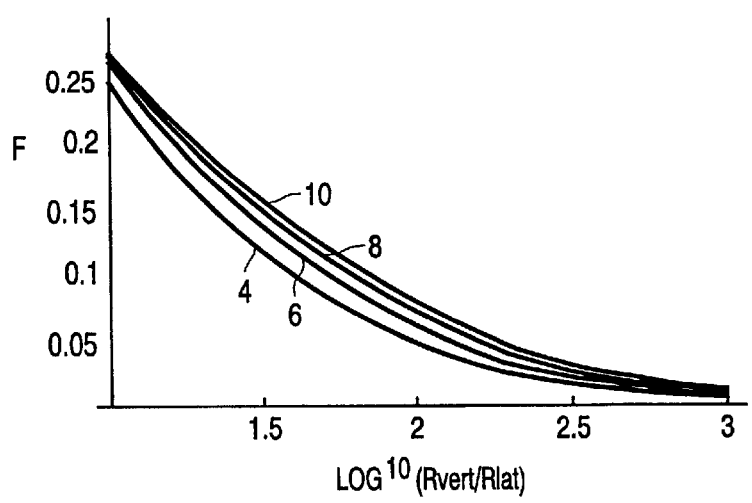
FIG. 4B is a graph of computer simulations of the fraction F of applied voltage that is dropped over the first lateral resistance segment between the top main electrode and the first (inner) vertical resistance segment as a function of Rvert/Rlat, for 4, 6, 8 and 10 segments.

The dashed lines V2 in FIG. 3 indicate equi-potential lines, showing a gentle lateral transition. Simulations using this stripe geometry were performed to estimate the resistivity required to obtain a gentle voltage drop-off. The resistance segments of magnitude Rvert and Rlat in the respective vertical and lateral paths 42 and 53 of the edge termination were represented using the simple FIG. 4A network of resistors Rvert and Rlat. The bottom electrode (and hence electrode region were at ground potential, with the voltage applied to the top electrode 31. FIG. 4A shows a specific situation in which the voltage step-down along the potential divider formed by the lateral path 53 is over three vertical paths 42. This is a scheme with three segments for the edge termination. FIG. 4B shows, as a function of Rvert/Rlat, the fraction F of the applied voltage which is dropped over the first resistive segment of path 53 between electrode 31 and first vertical path 53 that is beyond the electrode 31. The different line plots are the results for edge terminations with 4, 6, 8 and 10 segments.

It follows from FIG. 4B that the magnitude (in ohms) of the lateral resistor Rlat should be lower than the vertical resistor Rvert by a factor in the range of 10 to 500 (i.e. at least one order of magnitude), in order to achieve a voltage drop of between 5% and 25% of the total applied voltage over the first segment (i.e. over first lateral resistor Rlat directly next to the active area A). The situation in terms of resistivity (ohm.cm) is slightly complicated by the fact that the resistivity of the top resistive layer 53 might locally be affected by an interaction with the underlying structure, for example by interaction with the p-type region 23 in FIGS. 1 and 3.

In an extreme case there might be no voltage drop where the lateral resistive path 53 is in contact with quite highly doped (p+) underlying regions 23. This extreme case would limit the area in which a lateral voltage drop occurs to the region directly above the vertical SI-layers (or approximately half the total area at equal trench and mesa width). Taking this extreme situation into account, an estimate for the resistivity of the layer providing the lateral resistive path 53 can be given by:

$$\frac{\rho_{lat}}{\rho_{vert}} \approx \left(\frac{1}{250} \cdots \frac{1}{5}\right)\frac{L}{P_x}\frac{d}{w}$$

where $\rho_{lat}$ is the resistivity of the layer material of the lateral path 53, $\rho_{vert}$ is the resistivity of the material of the vertical path 42, L is the length of the vertical path 42, $P_x$ is the pitch (center-to-center spacing) of the vertical paths 42, w is width of the vertical path 42, and d is thickness of the layer of the lateral path 53.

It should be noted that it is not necessary for the resistivity $\rho_{lat}$ of the layer material of the lateral path 53 to be constant over the full edge termination. It can even be advantageous to use a low resistivity near the edge of the active area A (to control the voltage drop) and then a higher resistivity farther away (to reduce the leakage current and edge termination width y). A variety of possible implementations are illustrated in FIGS. 5 to 8.

Figure 5:
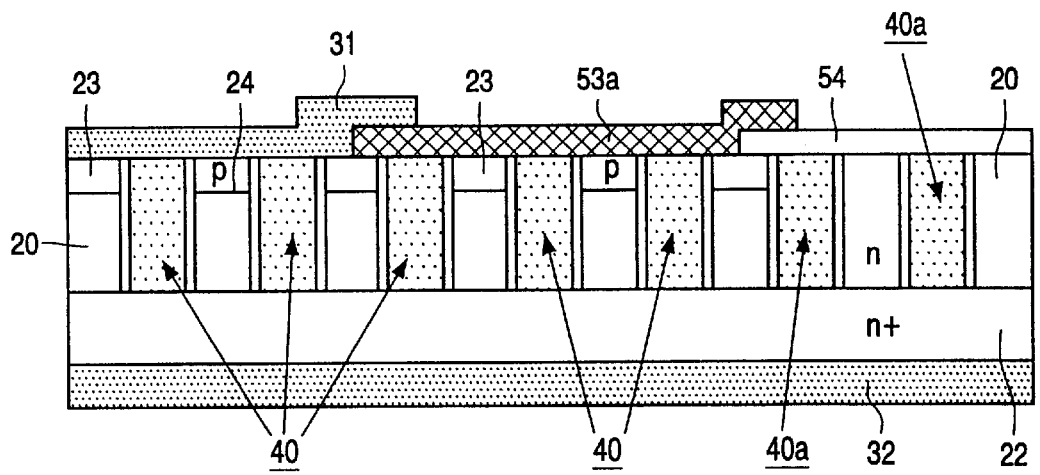
FIGS. 5 to 8 are diagrammatic cross-sectional views that are similar to FIG. 3 but illustrate different implementations of the lateral resistive path over the peripheral area of such a device in accordance with the invention.

In the FIG. 5 implementation, a resistive layer 53a connected to the electrode 31 runs laterally over several trenched field-shaping regions 40 and p-type regions 23 to end at an insulating layer 54. The resistive layer 53a may be of, for example, undoped polycrystalline silicon or polycrystalline silicon that is only lightly doped with a conductive dopant, for example boron or phosphorus. The insulating layer 54 may comprise, for example, silicon dioxide. FIG. 5 shows additional trenched field-shaping regions 40a below the insulating layer 54. Although these outermost regions 40a are not connected to the resistive layer 53a, they are connected to the bottom electrode region 22 and are also interconnected in the FIG. 2A configuration. However, these additional trenched field-shaping regions 40a need not be provided in the FIG. 5 structure. As illustrated in FIG. 5, the p-type region(s) 23 could also be omitted from below the insulating layer 54.

Figure 6:
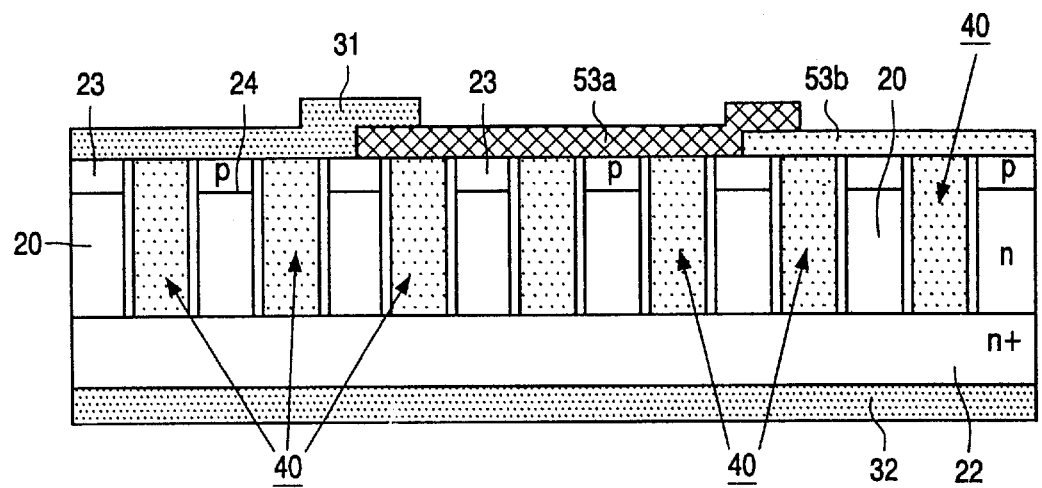

The FIG. 6 implementation is similar to that of FIG. 5, except that now the resistive layer 53a ends at another resistive layer 53b which is of a much higher resistance material. Thus, the path 53 that provides the potential divider has a resistance that increases to a higher value where connected to the outermost trenched field-shaping regions 40. Thus, a non-linear potential gradient is achieved for the potential divider. The layer 53b may be of semi-insulating material, for example polycrystalline silicon that is doped with oxygen and/or nitrogen. As such, its resistance may be an order of magnitude higher than that of layer 53a. Layer 53b may be the same semi-insulating material as provides the vertical paths 42 in the trenches 41. Where connected to inner trenched field-shaping regions 40, the resistive path layer 53 may comprise a layer 53a of undoped or lightly-doped polycrystalline silicon, as in FIG. 5.

Figure 7:
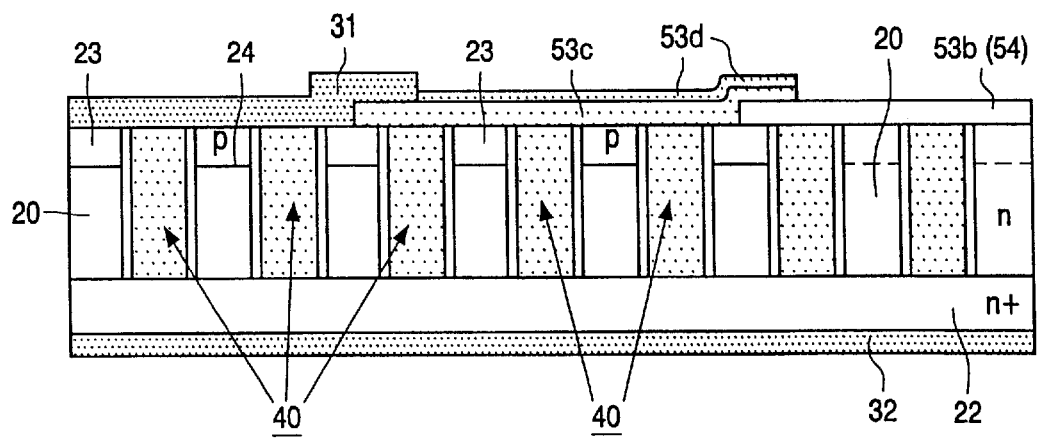

The FIG. 7 implementation is similar to that of FIGS. 5 and 6, except that semi-insulating material (for example, polycrystalline silicon doped with oxygen and/or nitrogen) is used for the layer 53c that provides the resistive path 53. However, this layer 53c is additionally doped with a conductivity dopant so as to be more conductive than the semi-insulating material of the trenched field-shaping regions. The conductive dopant may be, for example, boron or phosphorus that is ion implanted in the layer 53c. This additional conductive doping is illustrated by reference 53d in FIG. 7. The conductive doping dose may be laterally uniform along the layer 53c. Alternatively known graded partial-masking techniques may be used during the implantation to grade the doping 53d from a high dose near the active area A to a lower dose towards the outer field-shaping regions 40. Thus, the resistive path provided by the doped layer 53c,53d may have a resistance that increases to a higher value towards the outermost regions 40. The doping gradient may reduce more rapidly as the layer 53c approaches the outermost field-shaping regions 40, thereby more rapidly increasing the potential gradient. The doped layer 53c,53d may end at a semi-insulating layer 53b as in FIG. 6 or at an insulating layer 54 as in FIG. 5.

Figure 8:
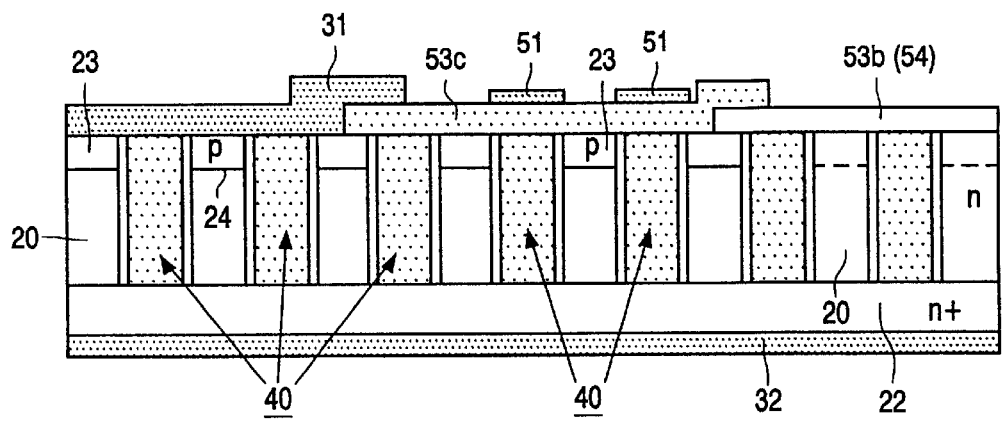

The FIG. 8 implementation is similar to that of FIG. 7 in having a layer 53c of semi-insulating material. However, in FIG. 8 the resistivity of the layer 53c is decreased in a different manner, namely by providing metal field plates. Thus, in this device, the layer 53c of semi-insulating material has conductive field-plates 51 on the semi-insulating material at the area of the trenched field-shaping regions 40, so as to be less resistive than the semi-insulating material 42 of the regions 40. Instead of metal deposited on the semi-insulating material 53c, the conductive field-plates 51 could be regions formed locally in the semi-insulating material 53c by, for example, ion implantation of conductivity-type dopant.

The trenched field-shaping regions 40 illustrated so far in FIGS. 1, & 3, & 5 to 8 have their trenches 41 filled with the semi-insulating material that provides the vertical resistive paths 42. In that case, the width w of the trench 41 provides the cross-section that determines the resistance Rvert of the path 42, as illustrated in FIG. 3. An extra degree of freedom in determining the resistance Rvert (to an optimum value higher than Rlat) can be achieved with the modification of FIG. 9.

Figure 9:
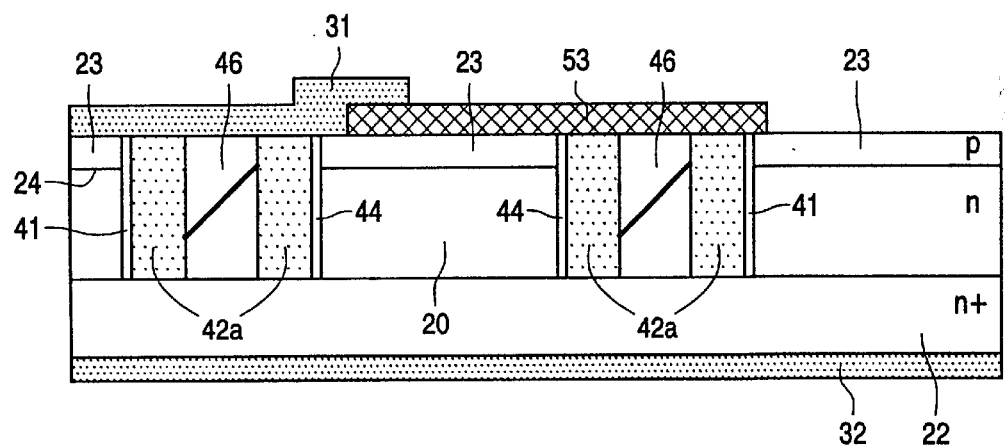
FIGS. 9 and 10 are diagrammatic cross-sectional views of part of the active device area and peripheral area of another two examples of such a device in accordance with the invention, illustrating different implementations for the trenched field-shaping regions in the active device area and the peripheral area.

In FIG. 9, the resistive path 42 of the trenched field-shaping regions 40 comprises a resistive layer 42a that extends along side-walls of the trenches 41. Although not shown in the drawing, the resistive layer 42a may also extend across the bottom of each/the trench 41. An insulating filler material 46 is present on the resistive layer 42a to fill the remainder of the trench 41. In this case, the thickness of the layer 42a provides the cross-section that determines the resistance Rvert of the path 42. Typically, the layer 42a comprises a semi-insulating material, for example, polycrystalline silicon doped with oxygen and/or nitrogen. The insulating filler material 46 may be, for example, a deposited silicon dioxide. Such a construction is disclosed in DE-A-198 48828, WO 01/59844, WO 01/59846, and WO 01/59847, for the active device area. Embodiments of the present invention (for example modifications of FIGS. 5 to 8) can utilize such a construction in both the active area A and the peripheral area P.

In all the embodiments so far illustrated, the voltage-sustaining zone 20 is a semiconductor region of a first conductivity type (n-type) that extends to the insulated side wall of the trench 41.

Figure 10:
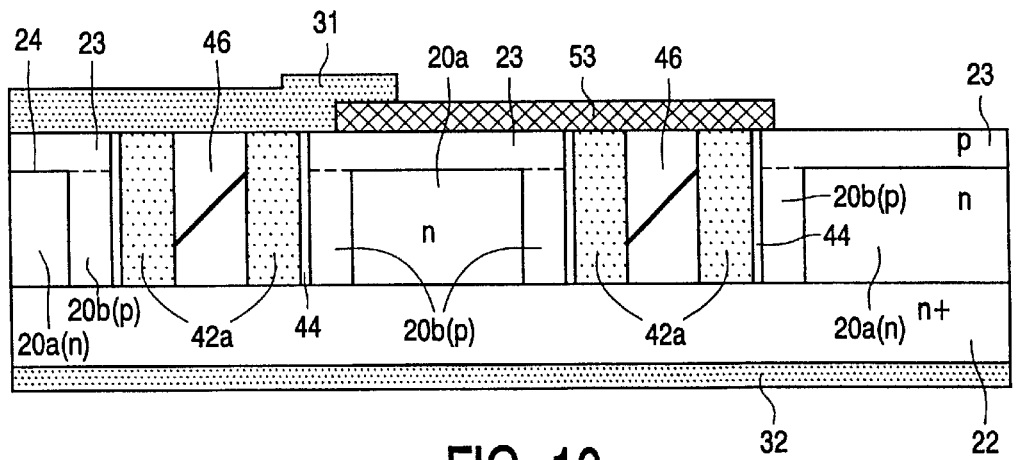

FIG. 10 illustrates a modification in which the voltage-sustaining zone 20 comprises interposed semiconductor first and second regions 20a and 20b of respective first and second conductivity types (n-type & p-type). The n-type regions 20a are separated from the side walls of the trenches 41 by the p-type regions 20b. The dimensions and dopant concentrations of these regions 20a and 20b are such that, when the voltage-sustaining zone 20 (20a, 20b) is depleted in the voltage-blocking mode, these depleted regions 20a and 20b have a space charge per unit area that substantially balances. However, the primary function of the p-type region 20b is to act as a shield for residual charge in the resistive layer 42a in the on-state of the device. Such a construction is disclosed in DE-A-198 48 828 and WO 01159846 (our ref. PHNL000067), for the active device area. Embodiments of the present invention (for example modifications of FIGS. 5 to 8) can utilize such a construction in both the active area A and the peripheral area P.

The various implementations so far illustrated for the resistive paths 42 and 53 and the voltage-sustaining zone 20 may be used for many device types in accordance with the invention. Particular examples are trench-gate MOSFETs, DMOS transistors, PN rectifier diodes, and Schottky rectifier diodes.

Figure 11:
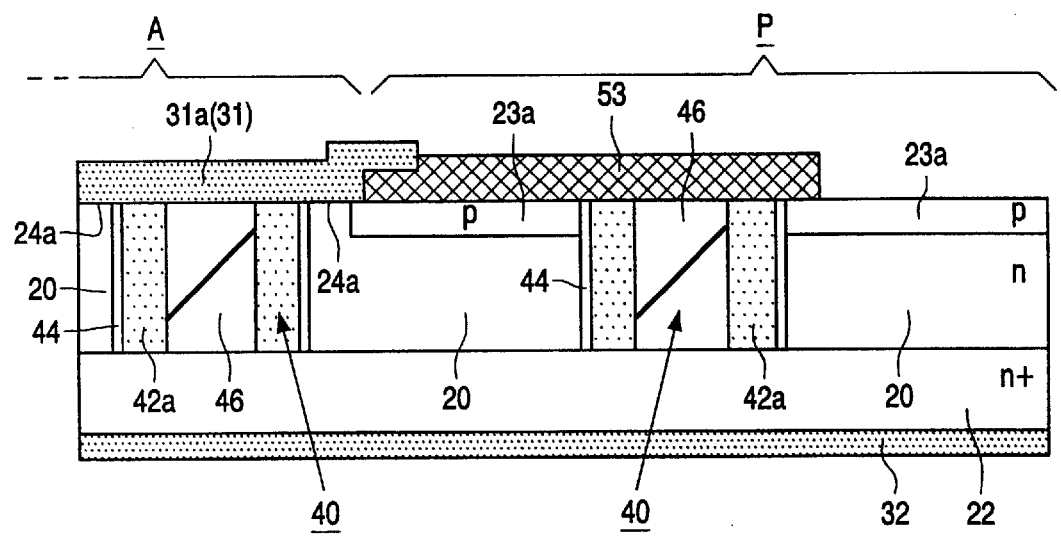
FIG. 11 is a diagrammatic cross-sectional view of part of the active device area and peripheral area of one example of a Schottky rectifier in accordance with the invention.

FIG. 11 illustrates a Schottky rectifier diode embodiment. In such a diode, the voltage-sustaining zone 20 extends to the top surface 11 of the body 10 in the active device area A, where a Schottky barrier 24a is formed with the anode electrode 31a. This Schottky electrode 31a effectively constitutes the top electrode region of the device, and it can be of different known forms. Thus, the electrode 31a may be wholly of a metal such as, for example, tungsten that forms the barrier 24a with the n-type silicon zone 20 and also forms the electrode connection 31. Alternatively, the electrode 31a may be composite of, for example, thick aluminium that forms the electrode connection 31 on a thin metal or metal silicide such as, for example, titanium or platinum silicide that forms the barrier 24a.

In a Schottky rectifier in accordance with the present invention, trenched field-shaping regions 40 are present in both the active device area A and the peripheral area P. The lateral resistive path 53 is provided in the peripheral area P as a potential divider to its regions 40. The voltage-sustaining zone 20 extends to the top surface 11 of the body, in between the trenched field-shaping regions at least in the active area A. In the specific example of FIG. 11, a p-type annular guard region 23a is present around the outside of the active area A, at the outside edge of the Schottky electrode 31a at the surface 11.

In the embodiments so far illustrated, a semiconductor region 23 or 23a of the opposite conductivity type (p-type) is present between the n-type voltage-sustaining zone 20 (or its n-type region 20a) and the top surface 11 of the body 10 and isolates the lateral resistive path 53 electrically from this n-type region/zone. However, modified device embodiments are possible in which the region 23 or 23a of the opposite conductivity type is absent in this area. One embodiment with the peripheral region 23, 23a omitted is illustrated in FIG. 12.

Figure 12:
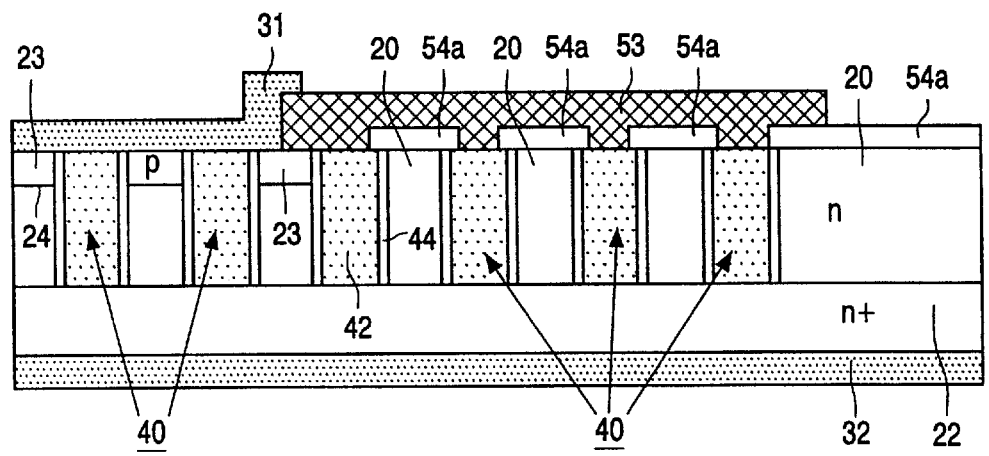
FIG. 12 is a diagrammatic cross-sectional view of part of the active device area and peripheral area of a further example of a device in accordance with the invention.

In the device of FIG. 12, an insulating layer 54a is present at the top surface 11 of the body 10 to isolate the voltage-sustaining zone 20 from the lateral resistive path 53. Windows are present in the insulating layer 54a where the further resistive path 53 is connected to the trenched field-shaping regions 40. Such a modification may be used for many device types in accordance with the invention, for example, trench-gate MOSFETs, DMOS transistors, PN rectifier diodes, and Schottky rectifier diodes. FIG. 12 illustrates its use in either a PN diode with anode region 23 in the active area A, or a MOS transistor with a p-type body region 23 in the active area A.

The lateral resistive path 53 may be in contact with the underlying surface-adjoining structure of the body 10 of some device structures. In this case, some electrical interaction may occur between the lateral path 53 and the underlying body surface-adjoining structure, as mentioned earlier in relation to FIG. 3. The contact may be with, for example, a p-type region 23 or 23a or with the n-type zone 20 where it extends to the surface. This interaction can be reduced, or even eliminated, by incorporating a barrier between the path 54 and the surface-adjoining zone 20 or region 23, 23a. The barrier may be a p-n junction or an insulating layer.

The p-n junction barrier can be formed by deliberately doping the material (resistive or semi-insulating) of the path 54 to have an opposite conductivity type to that of the surface-adjoining zone 20 or region 23, 23a. In the case of an oxygen-doped polycrystalline silicon layer 53b,53c, there is a tendency for its interface with a monocrystalline silicon surface 11 to behave in some ways as though it were a p-n junction.

The interaction can be eliminated by providing an intermediate insulating layer 54a of FIG. 12 between the path 53 and the surface-adjoining zone 20 or region 23, 23a. However, if complete isolation is not desired, a very limited, graded current flow may be incorporated between the path 53 and the underlying surface-adjoining structure in between the trenched field-shaping regions 40. This can be achieved with a very thin intermediate insulating layer through which tunnelling can occur, which may be formed as disclosed in U.S. Pat. No. 4,375,125.

In all the embodiments so far illustrated, the resistive path 42 of the trenched field-shaping regions 40 is separated from the voltage-sustaining zone 20 by an insulating layer 44 on the side-walls of the trench 41. However, embodiments are also possible in which the insulating layer 44 is omitted from the trenched field-shaping regions 40 of the active area A and of the peripheral area P.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. A semiconductor device comprising a semiconductor body that includes a voltage-sustaining zone between first and second device regions adjacent to respective first and second opposite surfaces of the body, the device regions having respective electrode connections, and trenched field-shaping regions including a resistive path that extends in trenches through the voltage-sustaining zone to the second device region, the trenches extending into the body from the first surface, the voltage-sustaining zone being so dimensioned and doped between the trenched field-shaping regions as to be depleted of free charge carriers between the trenched field-shaping regions in a voltage-blocking mode of operation, characterised in that the voltage-sustaining zone and the trenched field-shaping regions are present in both an active device area between the first and second device regions and in a peripheral area that extends around the periphery of the active area, and in that a further resistive path extends across the first surface, outwardly over the peripheral area to provide a potential divider that is connected respectively to successive underlying trenched field-shaping regions in the peripheral area thereby grading the potential applied by the successive trenched field-shaping regions in the peripheral area of the voltage-sustaining zone.

2. A device according to claim 1, further characterised in that the peripheral area having the successive trenched field-shaping regions connected to the potential divider extends laterally over a distance from the active device area that is larger than the thickness of the voltage-sustaining zone.

3. A device according to claim 2, further characterised in that the distance over which the peripheral area laterally extends is between 1 and 3 times the thickness of the voltage-sustaining zone.

4. A device according to claim 1, further characterised in that the resistance of the further resistive path that provides the potential divider is lower, for example an order of magnitude lower, than the resistance of the resistive path of the trenched field-shaping regions.

5. A device according to claim 4, further characterised in that the resistive path of the trenched field-shaping regions comprises a semi-insulating material.

6. A device according to claim 5, further characterised in that the semi-insulating material is polycrystalline silicon doped with oxygen and/or nitrogen.

7. A device according to claim 6, further characterised in that the further resistive path that provides the potential divider comprises polycrystalline silicon doped with oxygen and/or nitrogen but also additionally doped with a conductive dopant so as to be more conductive than the semi-insulating material of the trenched field-shaping regions.

8. A device according to claim 5, further characterised in that the further resistive path that provides the potential divider comprises a layer of semi-insulating material that has conductive field-plates on or in the semi-insulating material at the area of the trenched field-shaping regions so as to be less resistive than the semi-insulating material of the trenched field-shaping regions.

9. A device according to claim 6, further characterised in that the further resistive path that provides the potential divider comprises a layer of polycrystalline silicon that is either lightly doped with a conductive dopant or undoped.

10. A device according to claim 9, further characterised in that, where connected to outermost trenched field-shaping regions, the further resistive path that provides the potential divider comprises a layer of polycrystalline silicon that is doped with oxygen and/or nitrogen.

11. A device according to claim 1, further characterised in that the further resistive path that provides the potential divider has a resistance that increases to a higher value towards outermost trenched field-shaping regions.

12. A device according to claim 1, further characterised the trenched field-shaping regions in the peripheral area are a separate plurality from the trenched field-shaping region or regions in the active device area.

13. A device according to claim 12, further characterised the trenched field-shaping regions in the peripheral area comprise concentric annular regions that surround the active device area.

14. A device according to claim 12, further characterised the trenched field-shaping regions in the peripheral area comprise separate island regions that are distributed around the peripheral area.

15. A device according to claim 1, further characterised the trenched field-shaping regions in the active device area are in the form of a network that extends into the peripheral area to provide at least some of the trenched field-shaping regions in the peripheral area.

16. A device according to claim 1, further characterised in that the resistive path of the trenched field-shaping regions comprises a resistive layer that extends along side-walls of the trenches, and an insulating filler material is present on the resistive layer to fill the remainder of the trench.

17. A device according to claim 1, further characterised in that the resistive path of the trenched field-shaping regions is separated from the voltage-sustaining zone by an insulating layer on the side-walls of the trench.

18. A device according to claim 1, further characterised in that the voltage-sustaining zone is a semiconductor region of a first conductivity type.

19. A device according to claim 1, further characterised in that the voltage-sustaining zone comprises interposed semiconductor first and second regions of respective first and second conductivity types, in that the first regions are separated from the side walls of the trenches by the second regions, and in that the dimensions and dopant concentrations of the first and second regions are such that, when the voltage-sustaining zone is depleted in the voltage-blocking mode, the depleted first and second regions have a space charge per unit area that substantially balances.

20. A device according to claim 18, further characterised in that a semiconductor region of the second conductivity type is present between the voltage-sustaining zone and the first surface of the body to isolate the further resistive path electrically from the first conductivity type region of the voltage-sustaining zone.

21. A device according to claim 1, further characterised in that the voltage-sustaining zone is electrically isolated from the further resistive path that extends over the first surface of the body.

22. A device according to claim 21, further characterised in that an insulating layer is present at the first surface of the body to isolate the voltage-sustaining zone from the further resistive path, and in that windows are present in the insulating layer where the further resistive path is connected to the trenched field-shaping regions.

23. A device according to any one of claim 1, further characterised in that the voltage-sustaining zone extends to the first surface of the body, in between the trenched field-shaping regions.

24. A device according to any one of the preceding claim 1, further characterised in that the first device region is a Schottky electrode that forms with the voltage-sustaining zone a Schottky barrier of a Schottky rectifier.

25. A device according to claim 1, further characterised in that the first device region is a semiconductor region of the body that forms with the voltage-sustaining zone a p-n junction of a diode rectifier.

26. A device according to claim 1, further characterised in that the first and second device regions are respective source and drain regions of a field-effect transistor, and in that the source region is separated from the voltage-sustaining zone by a channel-accommodating body region of the transistor that forms a p-n junction with the voltage-sustaining zone.

27. A semiconductor device according to claim 1, further characterised in that the resistive paths of the trenched field-shaping regions in the active device area and the further resistive path of the potential divider are connected to a main electrode of the device that forms an electrode connection to the first device region.

* * * * *